United States Patent [19]

Masuda et al.

[11] Patent Number: 4,638,303
[45] Date of Patent: Jan. 20, 1987

[54] DIGITAL-ANALOG CONVERTER

[75] Inventors: Eiji Masuda; Shigemi Sakamoto, both of Kawasaki, Japan

[73] Assignee: Tokyo Shibaura Denki Kabushiki Kaisha, Kawasaki, Japan

[21] Appl. No.: 792,181

[22] Filed: Oct. 28, 1985

Related U.S. Application Data

[63] Continuation-in-part of Ser. No. 528,972, Sep. 2, 1983, abandoned.

[30] Foreign Application Priority Data

Jul. 9, 1982 [JP] Japan .................................. 57-155521

[51] Int. Cl.⁴ ............................................. H03K 13/02
[52] U.S. Cl. ....................... 340/347 DA; 340/347 CC; 340/347 M
[58] Field of Search ..... 340/347 DA, 347 M, 347 CC

[56] References Cited

U.S. PATENT DOCUMENTS 2,775,754 12/1956 Sink ............................. 340/347 M X
3,940,759 2/1976 Zitelli et al. ............. 340/347 CC X
3,997,892 12/1976 Susset .......................... 340/347 DA
4,338,591 7/1982 Tuthill ................................ 340/347

FOREIGN PATENT DOCUMENTS 4412584 3/1984 Japan .

OTHER PUBLICATIONS

The Engineering Staff of Analog Devices, Inc., Analog-Digital Conversion Handbook, 6/1972, pp. II-56 to II-59 and pp. I-8, II-80 to II-83.

Primary Examiner—T. J. Sloyan
Attorney, Agent, or Firm—Finnegan, Henderson, Farabow, Garrett & Dunner

[57] ABSTRACT

A digital-analog converter wherein reference voltage is divided by a first string-like resistor array, whose two adjacent outputs are selected by a first switch array depending upon the contents of upper bits of a digital signal and applied to the both ends of a second string-like resistor array, and one of switches in a second switch array is selectively turned on responsive to the contents of lower bits of said digital signal to pick up one of the divided voltages of said second resistor array.

8 Claims, 20 Drawing Figures

| DIGITAL INPUT SIGNAL (UPPER 7 BITS) | CLOSED SWITCH | OUTPUT VOLTAGE | |
|---|---|---|---|
| | | T132 | T133 |
| 128 | SW128, SW129 | V129 | V128 |
| 127 | SW127, SW128 | V127 | V128 |
| 126 | SW126, SW127 | V127 | V126 |
| ⋮ | ⋮ | ⋮ | ⋮ |
| 3 | SW3, SW4 | V3 | V4 |
| 2 | SW2, SW3 | V3 | V2 |
| 1 | SW1, SW2 | V1 | V2 |

F I G. 5
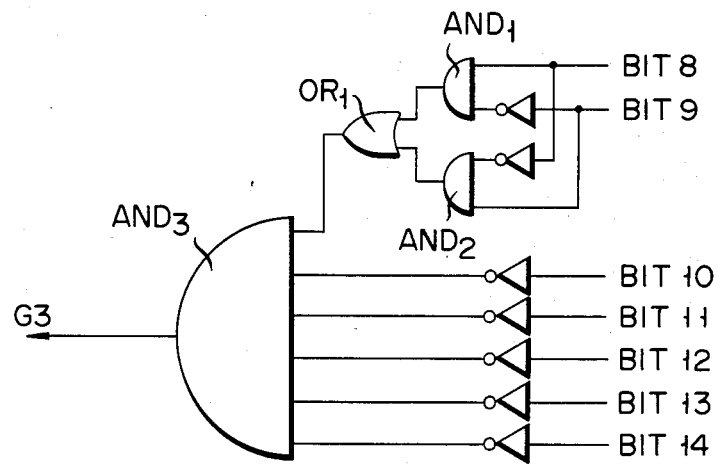
F I G. 6
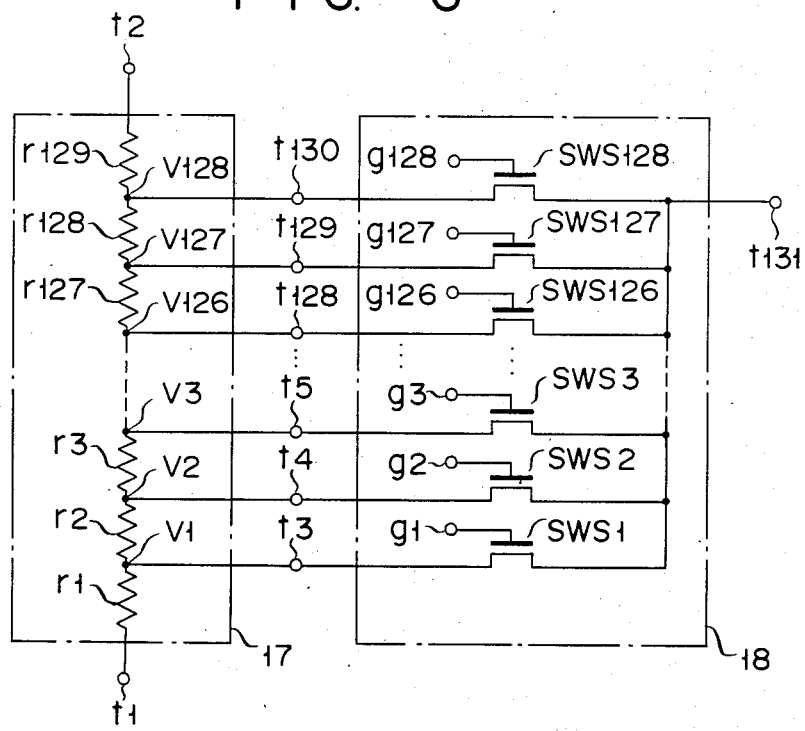

FIG. 7

| DIGITAL INPUT SIGNAL (LOWER 7 BITS) | VALUE OF LSB IN UPPER BITS (BIT 8) | | | |
|---|---|---|---|---|
| | 1 | | 0 | |
| | CLOSED SWITCH | OUTPUT VOLTAGE | CLOSED SWITCH | OUTPUT VOLTAGE |
| 128 | SWS 128 | V 128 | SWS 1 | V 1 |
| 127 | SWS 127 | V 127 | SWS 2 | V 2 |
| 126 | SWS 126 | V 126 | SWS 3 | V 3 |
| ⋮ | ⋮ | ⋮ | ⋮ | ⋮ |
| 3 | SWS 3 | V 3 | SWS 126 | V 126 |
| 2 | SWS 2 | V 2 | SWS 127 | V 127 |
| 1 | SWS 1 | V 1 | SWS 128 | V 128 | ns
DIGITAL-ANALOG CONVERTER

This application is a continuation-in-part of application Ser. No. 528,972, filed Sept. 2, 1983, abandoned.

BACKGROUND OF THE INVENTION

The present invention relates to a digital-analog converter capable of achieving high accuracy with a few elements and suitable for use in an MOS integrated circuit.

In digital audio devices, for example, various methods have been proposed to demodulate audio signals using a high accuracy digital-analog converter (which will be hereinafter referred to as D/A converter). This conventional D/A converter can be formed in different ways. In the case of a D/A converter in which a single resistor array consists of a plurality of resistors connected in a string, switched over by a single switch array, however, a large number of elements are needed to achieve high accuracy. When the D/A converter having such a arrangement is intended to convert digital signals, each having 14 bits, to analog signals, the number of resistor elements needed reaches about 16,000. Even when MOS-FET technology is considered, this D/A converter can not be realized because its chip size becomes extremely large.

U.S. Pat. No. 4,338,591, for example, discloses a D/A converter wherein a converter comprises a circuit for converting a group of upper bits and a group of lower bits, and an analog output obtained from the upper bits provides upper and lower limit voltages to apply to switch arrays for producing into analog data, and wherein an analog signal is obtained which is a voltage determined by the lower bits and ranging from the lower limit voltage to the upper limit voltage.

FIG. 1 is a block diagram showing an example of this type of D/A converter. Numeral 1 represents a series resistor array consisting of a plurality of resistors connected in a string and intending to divide constant voltages Ref+ and Ref− applied to both ends of said array. Numeral 2 denotes a first switch array for selecting two divided voltages of said series resistor array responsive to the group of upper bits U of a digital signal and for applying them to two buffer amplifier 3. Output voltages of said buffer amplifiers 3 are applied to a second switch array 4, and an output voltage V OUT is obtained through a group of ladder type resistors 5 each being of R-2R type, responsive to the group of lower bits L of the digital signal applied to the second switch array 4.

Since said series resistor circuit 1 and said ladder type R-2R resistor group 5 are different in structure, the conversion characteristics of the D/A converter are deteriorated when an analog output is obtained from each of the upper and lower bits of the digital signal even if the resistor of the series resistor circuit 1 and ladder type R-2R resistors group 5 are made equally precise. Hence, it would be extremely difficult to manufacture the D/A converter in the form of a monolithic integrated circuit. The same is true even when the accuracy of resistor values is similarly controlled in said both circuits. Further, the ladder type R-2R resistors of group 5 are connected to the switch array 4 to which the group of lower bits L of the digital signal are applied. To achieve high accuracy by means of this ladder type resistors group 5, the resistor elements located particularly on the side of the upper bits must be trimmed to have correct values, thus making the cost high. Furthermore, this type of D/A converter is arranged so that output voltages of said buffer 3 are applied to the ladder type resistors group 5 through the second switch array 4. Therefore, error occurs in voltages supplied to the ladder type resistors group 5 because of the irregularity of resistor when the second switch array 4 is under operation. This makes it impossible to achieve high accuracy.

SUMMARY OF THE INVENTION

An object of the present invention is to provide a digital-analog converter capable of eliminating the adverse effects on conversion characteristics induced by the irregularity of on-registances of switches, so as to convert digital signal to analog signals with high accuracy.

Another object of the present invention is to provide a digital-analog converter which is suitable for production as a low cost MOS-FET IC.

The present invention provides a digital-analog converter which can convert digital signals to analog signals with high accuracy with few a required elements, and which can easily be made in the form of a MOS-FET IC.

BRIEF DESCRIPTION OF THE DRAWINGS

FIG. 5 is a circuit diagram showing a first decoder employed in the converter of FIG. 2;

FIG. 6 is a circuit diagram showing a second resistor array and a second switch array both being employed in the converter shown in FIG. 2;

FIG. 7 is a table used to explain the operation of the second switch array shown in FIG. 6;

DETAILED DESCRIPTION OF THE PREFERRED EMBODIMENTS

Figure 2:
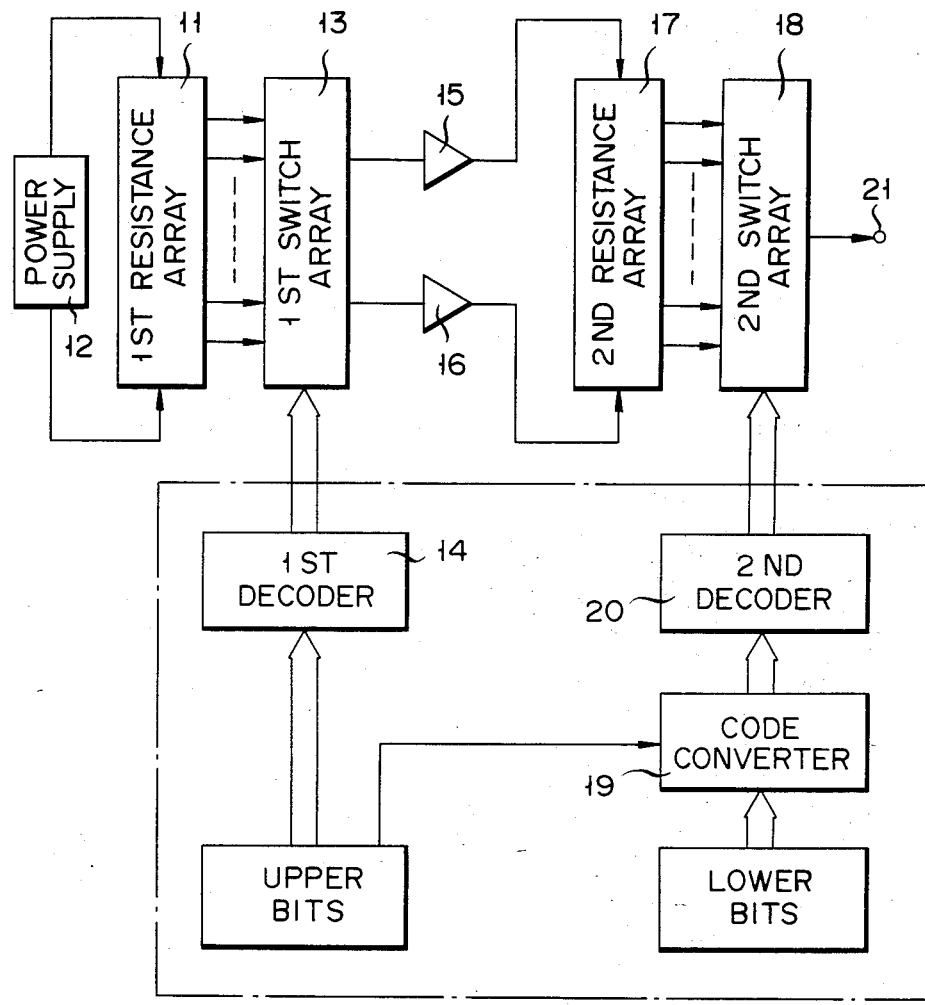
FIG. 2 is a block diagram showing a digital-analog converter according to the present invention.

An embodiment of the present invention will be described below with reference to the drawings. FIG. 2 is a block diagram showing a digital-analog converter which is intended to convert Q-bit digital signals to analog signals. Numeral 11 represents a first resistor array consisting of several resistors connected in a string and designed to divide voltages applied from a power supply 12 to both ends of said array 11, into M-unit e.g., units $2^m+1$. Numeral 13 denotes a first switch array to which said divided voltages are applied from the first resistor array 11. This first switch array 13 is controlled by a first decoder 14 to which the m upper bits of a digital signal to be converted is applied. More specifically, the first decoder 14 is controlled in such a way that one of the $2^m+1$ outputs is selected according to the contents of the m-bit digital signal and two corresponding switches adjacent to each other in the first switch array 13 are turned on by this output. Divided voltages selected by the two selected switches of said first switch array 13 are applied from the first resistor array 11 to both ends of a second resistor array 17 via buffer amplifiers 15 and 16. The second resistor array 17 consists of several resistors connected in a string designed to divide voltages, which have been applied through the buffer amplifiers 15 and 16, to N-unit e.g., $2^n$ units in which $m+n=Q$. Divided voltages of the second resistor array 17 are selected by a second switch array 18.

The second switch array 18 is controlled by a second decoder 20 to which the n lower bits of the digital signal to be analog-converted is applied after it is code-converted by a code converter 19. More specifically, the second decoder 20 selects one of the $2^n$ outputs according to the contents of the n-bit signal applied from the code converter 19 to turn on a switch in the second switch array 18, so that a voltage thus obtained is supplied, as an output, through an analog output terminal 21 thereof. The code decoder 19 serves to code-convert the lower bits of the signal according to the contents of the lowest bit of the upper bits of the signal.

A more concrete embodiment of the present invention wherein digital signals of straight binary code type each having 14 bits consisting of an upper group of 7 bits and a lower group of 7 bits are converted to analog signals will now be described in detail with reference to FIGS. 3 through 6.

Figures 3, 4:
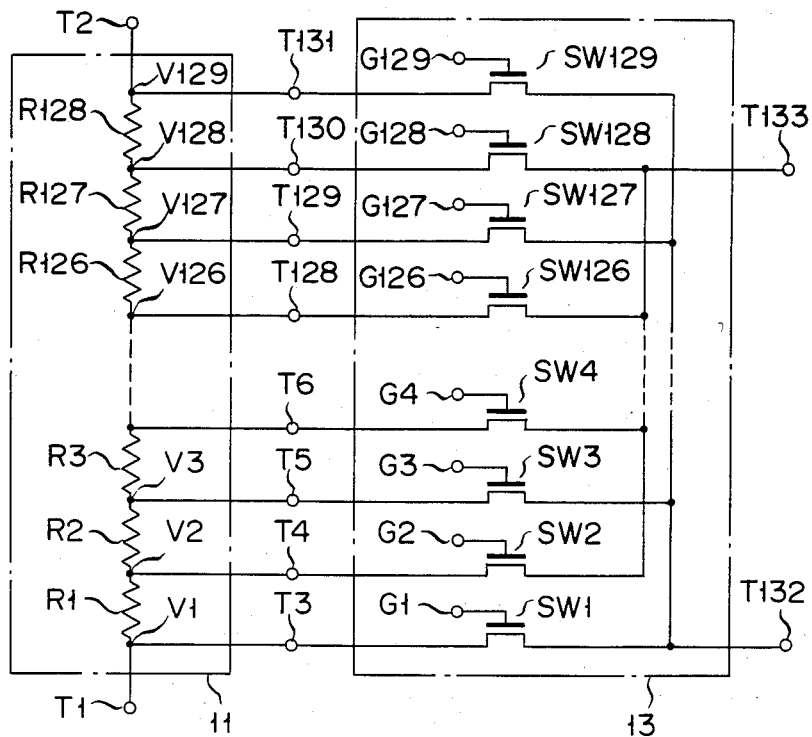
FIG. 3 is a circuit diagram showing a first resistor array and a first switch array both being employed in the digital-analog converter shown in FIG. 2.
FIG. 4 is a table intended to explain the operation of the first switch array shown in FIG. 3.

FIG. 3 is a circuit diagram showing the first resistor and switch arrays 11 and 13. The first resistor array 11 comprises $2^7$ units of resistors R1, R2, ..., R128 connected in a string, and both ends of said first resistor array 11 are connected to the power supply 12 (which is not shown) through terminals T1 and T2. The 129 units of divided voltages V1, V2, ..., V129 obtained through the points connected in series between the resistors R1, R2, ..., R128 are applied via terminals T3, T4, ..., T131 to inputs of analog switches SW1, SW2, ..., SW129 in which FET is employed. Outputs of odd-numbered analog switches SW1, SW3, ..., SW129 are commonly connected to an output terminal T132 while outputs of even-numbered analog switches SW2, SW4, ..., SW128 are connected to an output terminal T133. Gate terminals G1, G2, ..., G129 of analog switches SW1, SW2, ..., SW129 receive control signals applied from the first decoder 14 (not shown). Resistor values of the resistors R1, R2, ..., R128 in the first resistor array 11 are made equal to one another.

The first decoder 14 turns on two switches in the first switch array 13 successively according to the contents of the upper bits of the digital signal, as shown in FIG. 4. When values of the upper bits increase, for example, a divided voltage on the high potential side of said first resistor array 11 is selected while another divided voltage on its adjacent higher potential side is selected. When values of the upper bits decrease, a divided voltage on the low potential side is selected while another divided voltage on its adjacent lower potential side is selected. Therefore, the switch SW3, for example, is turned on when values of the upper bits are 2 and 3, as apparent from FIG. 4. Therefore, when the first switch array 13 is formed using an N-channel FET, for example, a High-level signal may be applied to the gate terminal of a switch which is to be turned on. Similarly, switches SW2, SW4, ..., SW128 are turned on according to the corresponding two values of the upper bits. The switch SW1 is turned on only when the value of the upper bits is 1, while the switch SW129 is turned on only when the value of the upper bits is 128.

In the case of a circuit of the first decoder 14 related to switch SW3 shown in FIG. 5, for example, the signals of bits 8 and 9 among the signals of bits 8 through 14 of the upper bits group are applied to one set of inputs of "and" gates $AND_1$ $AND_2$, respectively, while inverted signals of bits 8 and 9 are applied to the other inputs "and" gates $AND_1$ and $AND_2$. The logical sum of outputs of "and" gates $AND_1$ and $AND_2$ is obtained through an "or" gate $OR_1$. Signals of bits 10 through 14 are inverted and applied to inputs of a six input "and" gate $AND_3$ while the output of said "or" gate $OR_1$ is further applied to this six input "and" gate $AND_3$ so as to obtain their logical sum, which is applied to the gate terminal G3 of said switch SW3. According to the logical circuit shown in FIG. 5, the output of "and" gate $AND_3$ becomes "H" only when the value of bits 8 through 14 of the upper bits group is 2 or 3, thus allowing the switch 3 to be turned on. Needless to say, logical circuits of said switches SW1, SW2, SW4, ..., SW129 are arranged in such a way that they are turned on in accordance with the corresponding values of said upper bits group, respectively.

FIG. 6 is a circuit diagram showing the second resistor and switch arrays 17 and 18. The second resistor array 17 comprises $2^7+1$ resistors r1 to r129 connected to a string. Voltages selected by the first switch array 13 are applied to both end terminals t1 and t2 of said second resistor array 17 through buffer amplifiers 15 and 16. The resistor value of said resistors r1 and r129 located at both ends of said second resistor array 17 is set at half that of said resistors r2, r3, ..., r128 located between said resistors r1 and r129. The 128 units of divided voltages v1, v2, ..., v128 obtained through those points of resistors r1 to r128 which are connected in series are applied to inputs of FET-employed analog switches SWS1, SWS2, ..., SWS128 via terminals t3, t4, ..., t130. Outputs of switches SWS1, SWS2, ..., SWS128 are connected in parallel to an analog output terminal t131 and gates of said switches are connected to gate terminals g1, g2, ..., g128. Control signals are applied from the second decoder 20 to the gate terminals g1, g2, ..., g128 to selectively turn on one of the switches in the second switch array 18 according to the contents of lower bits group of the digital signal. More specifically, the lower bits group of the digital signal is applied to the code converter 19, and when the content of the lowest bit of said upper bits group is "H", all of the bits are inverted and when the group is "L", the bits are applied to the second decoder 20. the decoder 20 turns on one of the switches in the second switch array 18 according to the content of the 7 bits applied from the code converter 19, as shown in FIG. 7.

For converting straight binary code digital signals to analog signals, the situation where all bits of the digital signal are "L" corresponds to the smallest analog output. Similarly, the largest analog output situation occurs when the all of bits of the ditial signal are "H". When the voltage of the power supply is equally divided into $2^{14}-1$, steps, the lowest of the bits of the digital signal corresponds to quantized voltage step. In this case, therefore, the conversion property of the circuit is such that the voltage of the analog outputs increases by one quantized voltage step every time the value of the digital signal increases by one.

Figure 8:
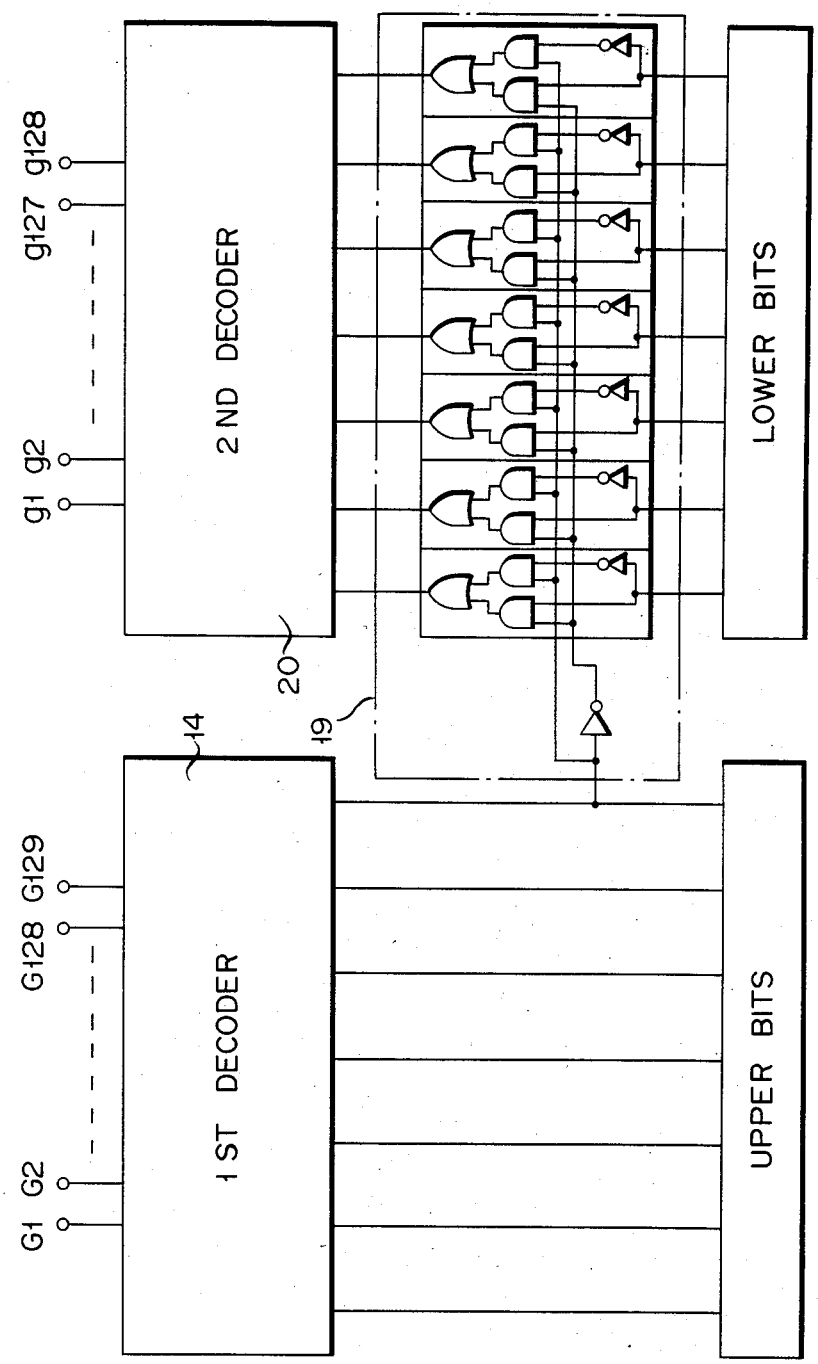
FIG. 8 is a circuit diagram showing a code converter in the converter shown in FIG. 2.

The construction of the code converter can be made extremely simple when straight binary coded digital signals are applied thereto. As shown in FIG. 8, the contents of the lower bits group are inverted and applied to the second decoder 20 when the value of the lowest bit of the upper bits group is "L". When it is "H", the content of the lower bits group is applied to the second decoder 20. When operated like this, if the amplitude relationship of the output values of the buffer amplifiers 15 and 16 is changed by increasing or decreasing the contents of said upper bits group, the contents of said lower bits are also inverted. Thus the monotony of voltage values of said analog output is kept unchanged.

When this circuit is integrated, each of said resistor arrays 11 and 17 may be formed by thin film resistors, polysilicon resistors, diffusion resistors and so on. Since the buffer amplifiers 15 and 16 serve only to carry out impedance conversion, they may consist of operational amplifiers connected in voltage follower type and having an amplifying ratio of 1.

When the more concrete embodiment of the present invention shown in FIGS. 3 through 8 is thus arranged, and provided the voltage of said power supply 12 is Vr, this voltage Vr is applied to both ends of said first resistor array 11. The x-th divided voltage Vx can be expressed as follows:

$$Vx = \frac{(x-1) \times Vr}{2^7} \quad (1)$$

The first switch array 13 selects output voltages Vx and Vx+1 of adjacent output terminals Tx and Tx+1 in the first resistor array 11 in response to the content of the upper 7-bit group of the digital signal. The relationship of output voltages Vm and Vm+1 of said first switch array 13 to the contents of the lowest bit 8 of the upper bits group is as follows. When the bit 8 is "L", Vm<Vm+1, and when it is "H", Vm>Vm+1.

The output voltages Vm and Vm+1 are applied to both ends t1 and t2 of said second resistor array 17 via the terminals T132, T133 and the buffer amplifiers 15, 16. Therefore, output voltage Vy of the y-th output terminal ty in the second resistor array 17 can be calculated by the following equation (2) when bit 8 of the digital signal is "H", and by the following equation (3) when it is "L".

$$Vy = Vx + \left(\frac{Vx + 1 - Vx}{2^7}\right)(y - 1) \quad (2)$$

$$Vy = Vx + 1 - \left(\frac{Vx + 1 - Vx}{2^7}\right)(y - 1) \quad (3)$$

Analog outputs can be therefore obtained with the accuracy of the smallest voltage step $$\frac{Vx + 1 - Vx}{2^7}$$

responsive to the contents of lower bits groups of the digital signal.

Providing that the contents of lower bits group are represented by P, y=p when the bit 8 is "L", and y=129−P when it is "H", the following equation (4) can be derived from the equations (2) and (3).

$$Vx \cdot y = Vx + \left(\frac{Vx + 1 - Vx}{2^7}\right)(P - 1) \quad (4)$$

When the equation (4) is substituted for equation (1), $$Vx \cdot y = \frac{Vr}{2^7}(x - 1) + \left(\frac{Vr}{2^7 \cdot 2^7}\right)(P - 1) \quad (5)$$

Therefore, the x-th divided voltage of the first resistor array is selected in response to the contents of the upper bits group and the y-th divided voltage of the second resistor array 17 is selected in response to the contents of the lower bits group, so that analog outputs can be obtained from the digital signal with an accuracy of 14 bits.

According to a more sophisticated embodiment of the present invention, each of the first and second resistor arrays 11 and 17 is a divider circuit consisting of several resistors connected with one another in a string. The construction of resistor arrays is simpler and higher accuracy is achieved easily when these arrays are compared with the divider circuit of R-2R type employed by the conventional converter shown in FIG. 1. This divider circuit formed in a string can easily create excellent monotony and differential linearity characteristics and allow for resistor values with large error tolerance so that high accuracy may be attained. In addition, each of the upper and lower bits groups is provided with the resistor and switch arrays. This allows the number of elements required to be remarkably reduced as compared with the D/A converter provided only with one set of resistor and switch arrays. In the D/A converter for analog-converting 14-bit digital signals, for example, the number of resistor and switch elements can be reduced from $2^{14}$ to about $2^7 \times 2$. This converter can be easily fabricated on a semiconductor integrated circuit, hence enhancing productivity and lowering the cost.

In case of the D/A converter which has been described in the more concrete embodiment of the present invention, the relationship of the magnitude of two outputs selected by the first switch array is reversed by increasing or decreasing the contents of the upper bits group. This keeps monotony and differential linearity characteristics from being lost by offset voltages of buffer amplifiers 15 and 16, for example.

Figure 1:
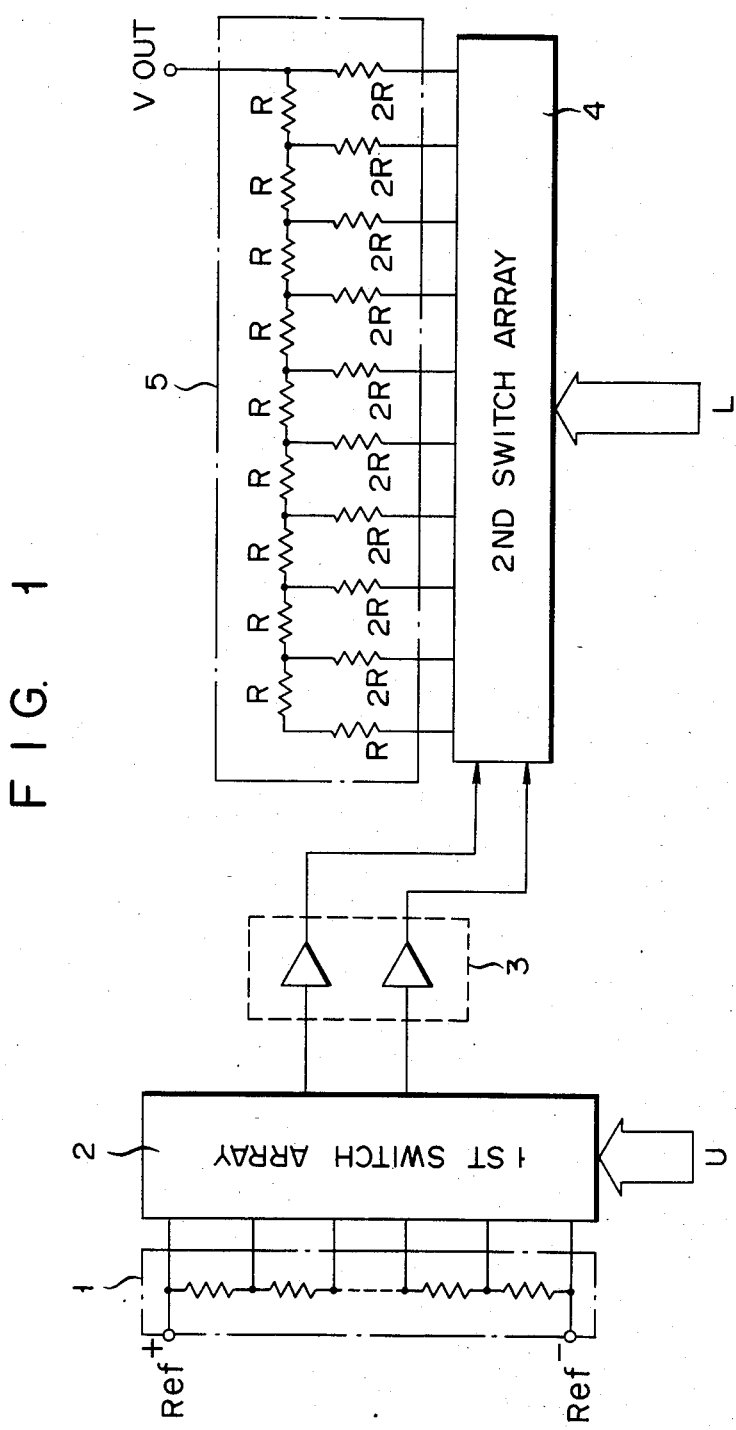
FIG. 1 is a block diagram showing a conventional digital-analog converter.

Outputs of the buffer amplifiers 15 and 16 are not supplied to the resistor array through the switch array as seen in the prior art of FIG. 1, but are instead supplied directly to the second resistor array 17 in the more sophisticated example of D/A converter. Therefore, divided voltages of the first resistor array 11 which are obtained by dividing the reference voltage can be transmitted to the second resistor array 17 with high accuracy but without being influenced by errors in on-resistance values of the switch arrays. In the D/A converter described above, the error allowance can therefore be made substantially equal in the resistor arrays 11 and 17. The D/A conversion accuracy of the D/A converter, as a whole, is thus best improved. In addition, no specific trimming is needed to attain high accuracy. As the result, this D/A converter is low in cost and suitable for an IC. Further, code conversion of the lower bits group can be realized by a simply arranged digital signal processing circuit such as that shown in FIG. 8. In addition, theoretically no error occurs. This D/A converter can thus achieve extremely high accuracy and carry out a stable operation.

Figure 9A:
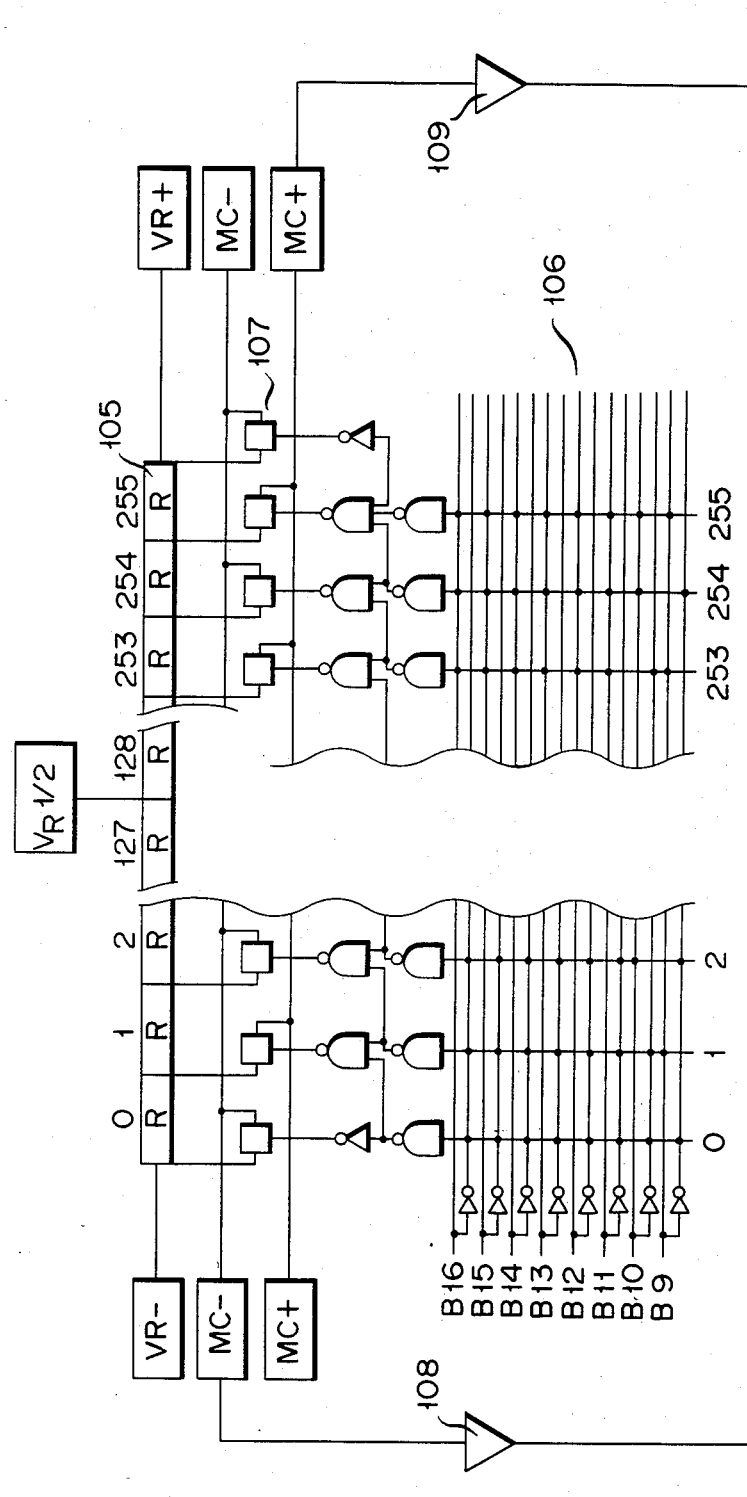
FIGS. 9A to 9C are block diagram showing a concrete example of digital-analog converter according to the present invention.
Figure 9B:
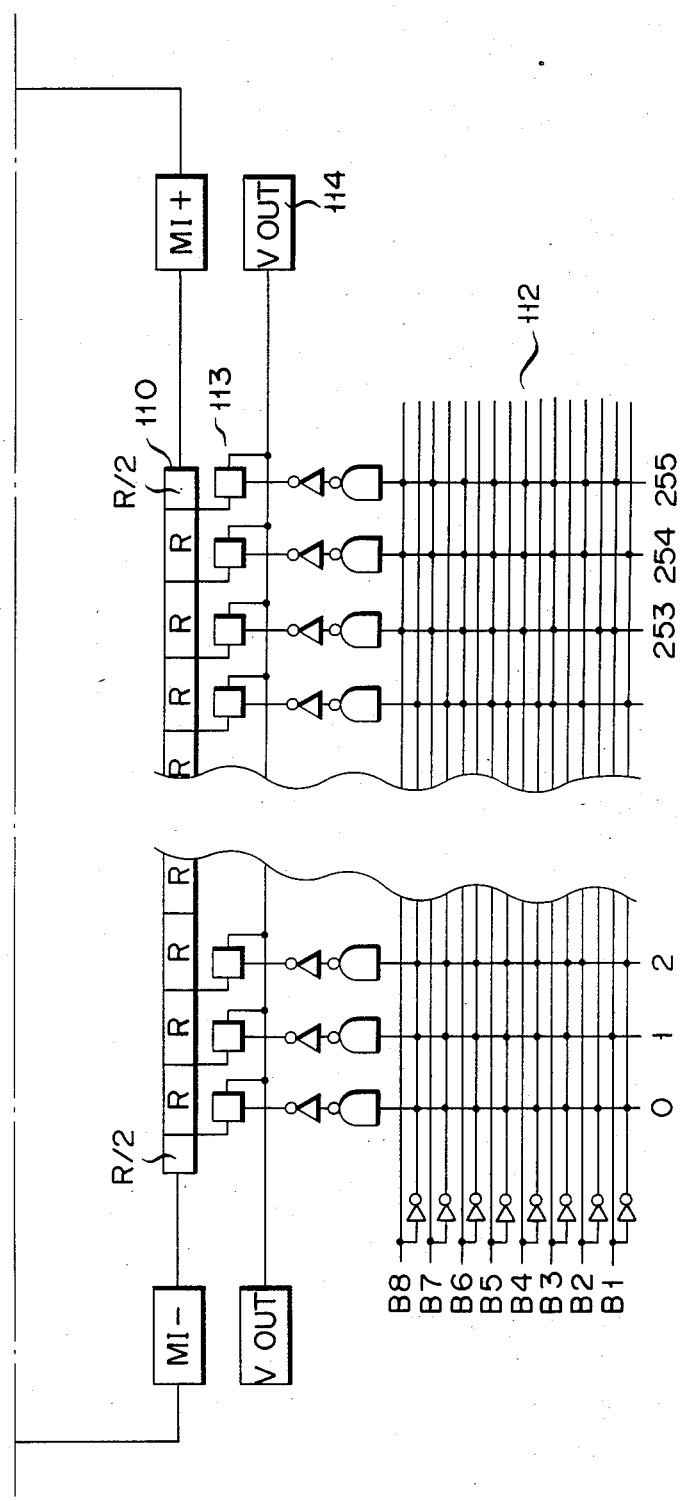
Figure 9C:
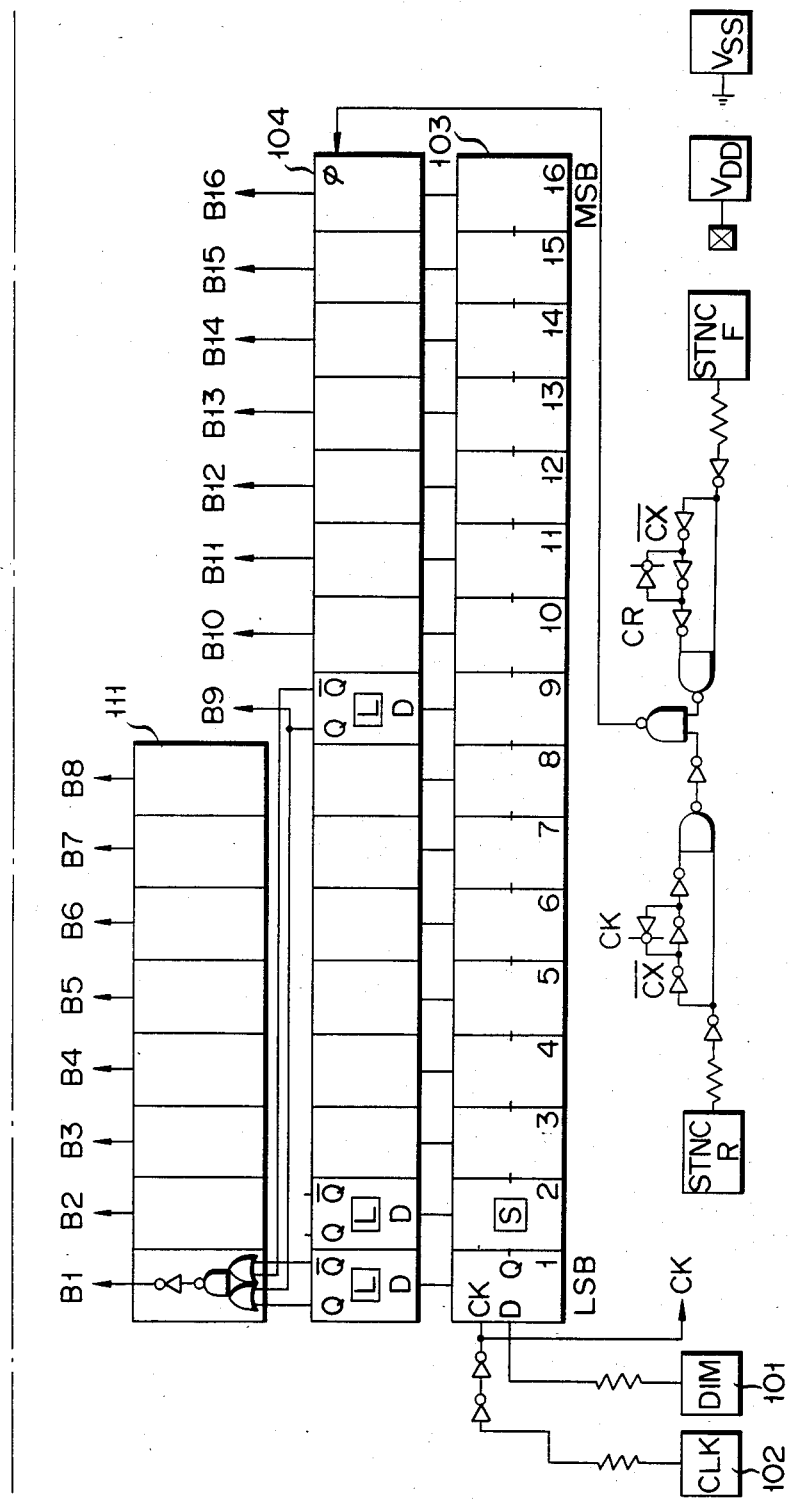

FIGS. 9A to 9C are circuit diagrams showing a D/A converter for analog-converting digital signals each having 16 bits, wherein a digital signal of 16 bits is applied in series to a data input 101. Synchronized with clock signals applied to a clock terminal 102, the digital signal is read in a 16-bit shift register 103 successively. The contents of said shaft register 103 are transferred to and stored in a 16-bit latch 104. On the other hand, reference voltages ±VR are applied to both ends of a first string-like resistance array 105 which consists of 256 units of resistors connected in series. In response to the outputs of a first decoder 106 consisting of a logic matrix, to which upper bits B9 to B16 of the digital signal are applied, two adjacent switches in a first switch array 107 are selectively turned on to pick up divided voltages from the first resistor array 105. The voltages picked up by the first switch array 107 are applied to the both ends of a second string-like resistor array 110 via buffer amplifiers 108 and 109, said second resistor array 110 consisting of 256 units of resistors connected in series with one another. Divided voltages of said second resistor array 110 are picked up by a second decoder 112 and supplied through an analog output terminal 114. The second decoder 112 serving to selectively turn on one of the switches in a second switch array 113 responsive to outputs of a code converter 111, and consisting of a diode matrix. The code converter 111 receives lower bits B1 to B8 of the digital signal and code-converters their contents in response to the contents of the lowest bit of upper bits group.

Figure 10:
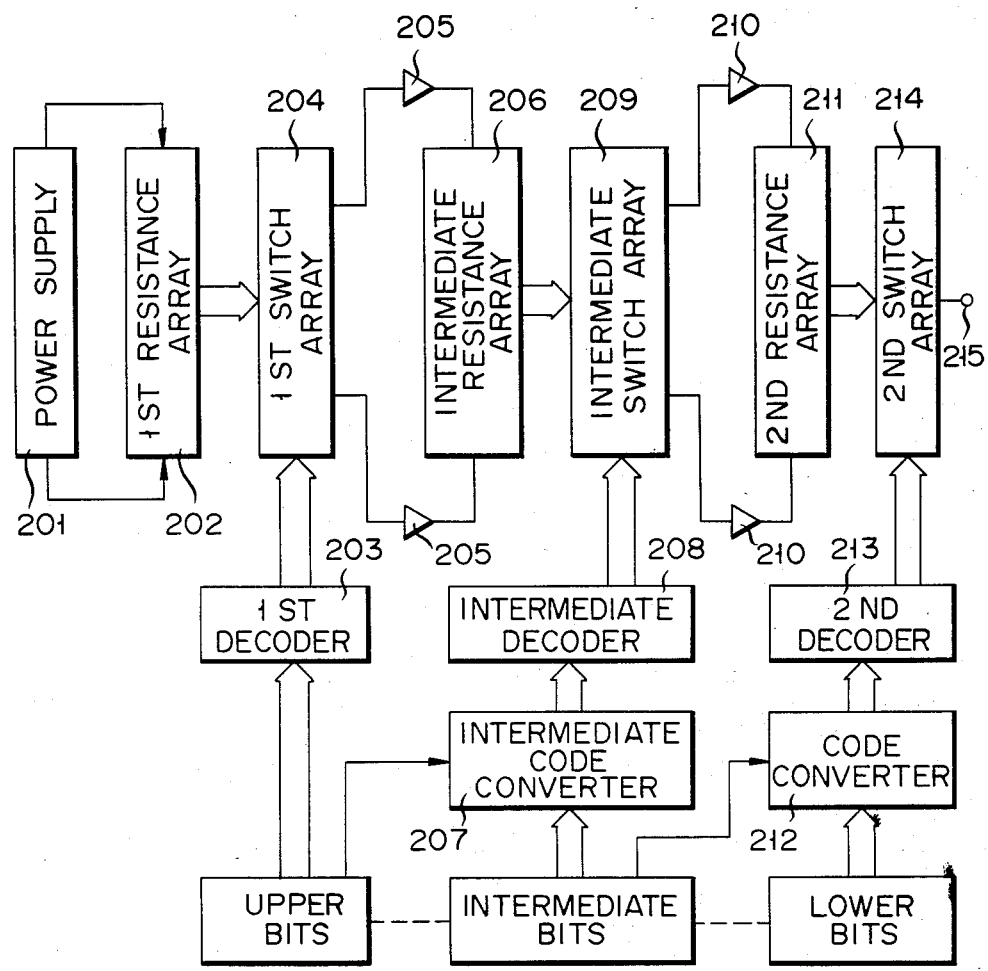
FIG. 10 is a block diagram another digital-analog converter according to the present invention.

FIG. 10 shows another embodiment of the present invention wherein a digital signal which is to be converted to an analog signal is divided into upper, intermediate and lower bits groups. A reference voltage is applied from a power supply 201 to a first resistor array 202 and divided by this first resistor array 202. Divided voltages of said first resistor array 202 are selected by a first switch array 204, which is controlled in such a way that its two adjacent switches are turned on in response to outputs of a first decoder 203 to which the upper bits group of said digital signal is applied. The output voltages selected by the first switch array 204 are applied to both ends of an intermediate resistor array 206 via buffer amplifiers 205 and divided by the intermediate resistor array 206, which is similar in arrangement to the first resistor array 202. The signal of the intermediate bits group is code-converted by an intermediate code converter 207 responsive to the contents of the lowest bit of the upper bits group and applied to an intermediate decoder 208 which has same arrangement as that of said first decoder 203. An intermediate switch array 209 is controlled in such a way that its two adjacent switches are turned on in response to outputs of said intermediate decoder 208. Divided voltages of said intermediate resistor array 206, selected by said intermediate switch array 209, are applied to both ends of a second resistor array 211 via buffer amplifiers 210, and divided by said second resistor array 211. Further, the digital signal of the lower bits group is code-converted by a second code converter 212 responsive to the contents of the lowest bit of the intermediate bits group and applied to a second decoder 213.

One of switches in a second switch array 214 is selected and turned on in response to an output of the second decoder 213 to select a divided voltage from the second resistor array 211 and supply it as an analog-converted output through an output terminal 215. Even in a D/A converter having the arrangement described above, the first and intermediate decoders 203 and 208 apply their decoded outputs to the switch arrays 204 and 209, respectively, in such a way that one of two divided voltages selected by the first and intermediate switch arrays 204 and 209 is larger or smaller, the selection being alternately inverted depending upon increase or decrease of the contents of the bits of the digital signal.

When a highly accurate analog conversion output is required, the circuit of FIG. 2 causes the following two problems.

First Problem

Figure 11:
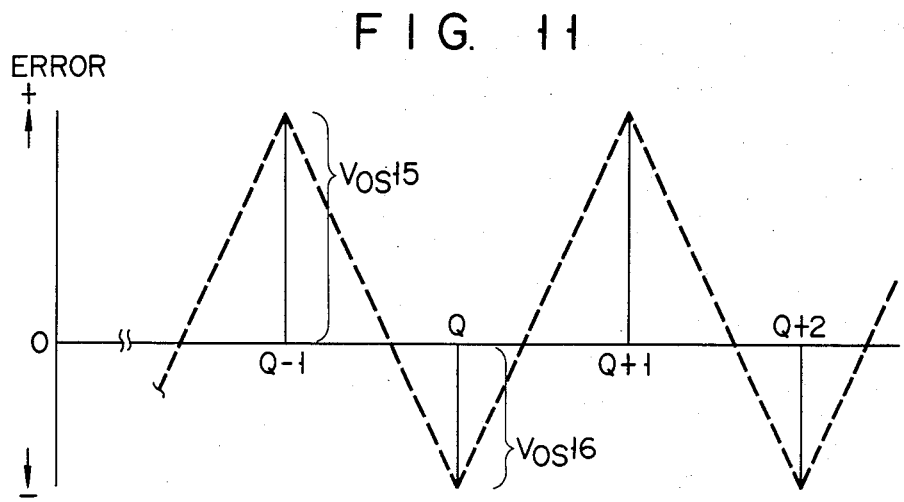
FIGS. 11 and 12 are graphs used in explaining conversion errors occurring due to buffer amplifier offset voltages.

A conversion error occurs due to the offset voltages Vos 15 and Vos 16 of the buffer amplifiers 15 and 16. If, for example, the offset voltage Vos 15 is positive and the offset voltage Vos 16 is negative and the absolute values of Vos 15 and 16 are nearly equal, then when all the lower bits of a digital signal are "0" (or "1") and the value "Q" of the upper bits changes in the manner of . . . , Q−1, Q, Q+1, Q+2, . . . , and positive and negative conversion errors alternately occur as shown in FIG. 11. In FIG. 11, the conversion error at the values of "Q−1, Q+1, . . . " of the upper bits is equal to the offset voltage Vos 15, and the conversion error at the values of "Q, Q+2, . . . " of the upper bits is equal to the offset voltage Vos 16. When the value of the lower bits of the digital code changes, the conversion error changes substantially linearly as shown in FIG. 11 by a broken line.

Figure 12:
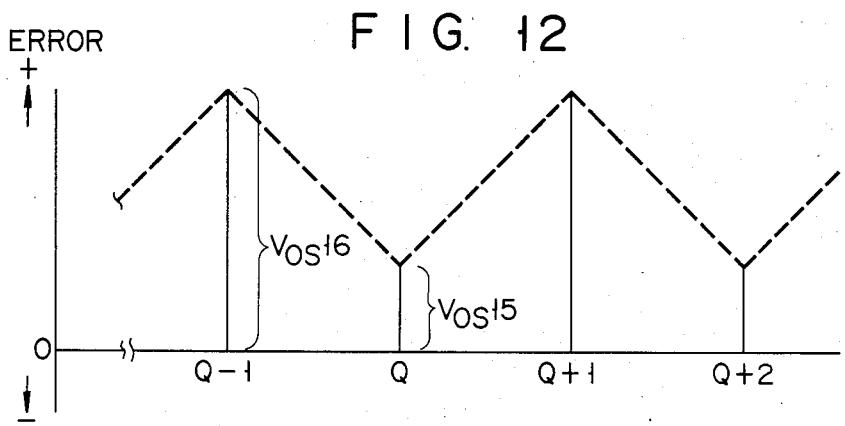

FIG. 12 shows the conversion error when the offset voltages Vos 15 and Vos 16 of the buffer amplifiers 15 and 16 are both positive, and Vos 16 Vos 15 0. If all of the lower bits of the digital signal are "0" (or "1"), and if the upper bits change in the manner of . . . , Q−1, Q, Q+1, Q+2, . . . , the conversion error becomes equal to Vos 16 and Vos 15, alternately. When the value of the lower bits changes, the conversion error increases and decreases substantially linearly as shown by a broken line in FIG. 12.

Second Problem

Even if there is no conversion error due to the offset, the following error counts. During manufacture of the second resistance array on a silicon chip, the thickness of a resistor film linearly increases along a string of laid-out resistors, causing erroneous values for the resistor element. Accordingly, the error of the N output voltages of the resistance array changes due to this linear variation.

Figure 13:
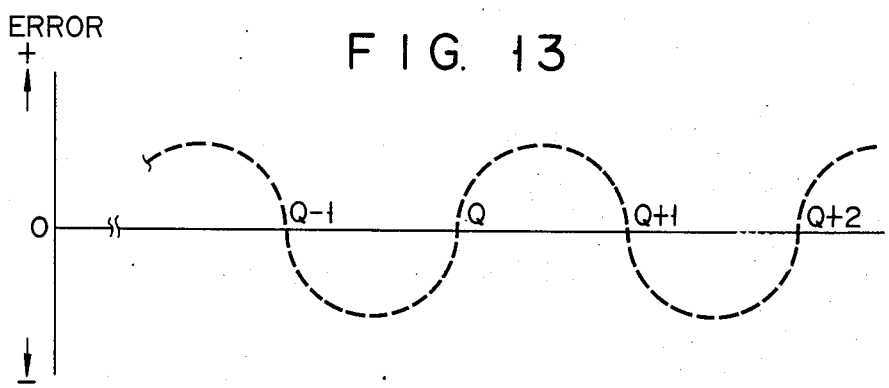
FIG. 13 is a graph for explaining conversion errors occurring due to errors in the second resistance of array.

When the value Q of the upper bits of the digital signal changes in the manner of . . . , Q−1, Q, Q+1, Q+2, . . . , the conversion error changes alternately in the positive region and the negative region as shown in FIG. 13. When all lower bits of the digital code are "0" (or "1"), the conversion error is substantially zero. Accordingly to the value of the lower bits, the conversion error changes with an arcuate locus as shown in FIG. 13.

Figure 14:
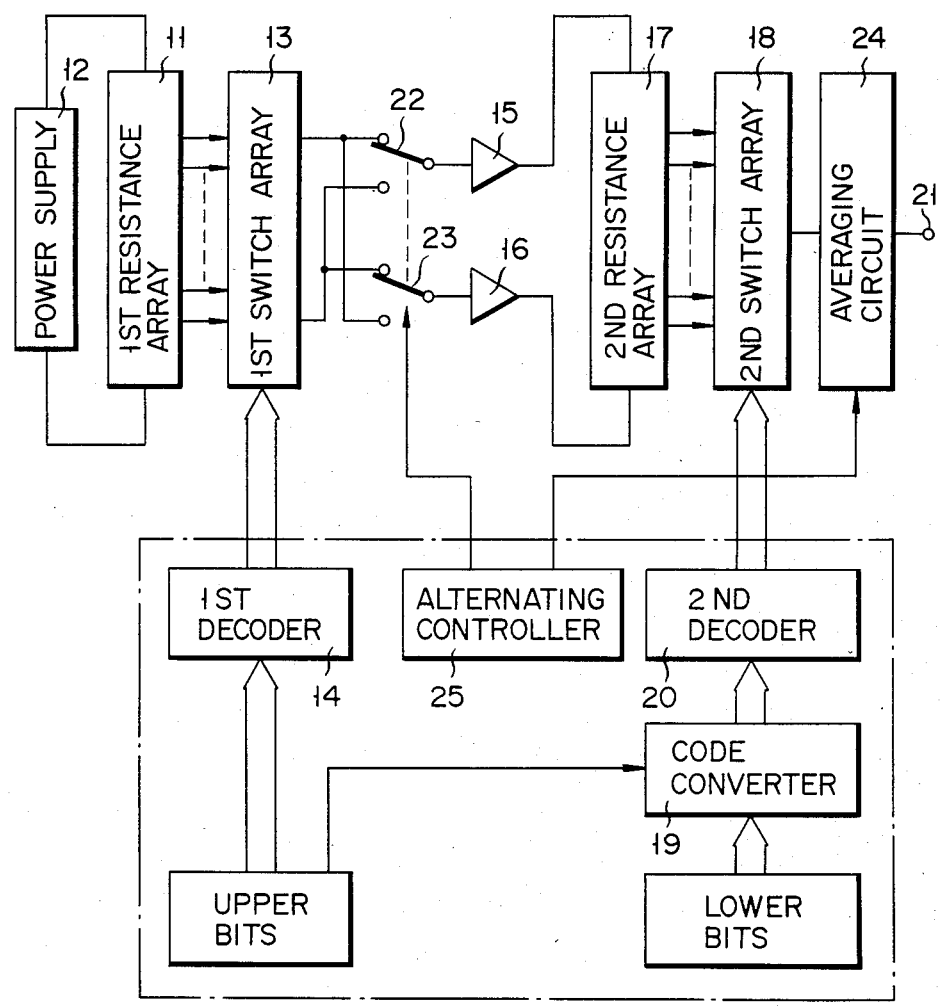
FIG. 14 is a block diagram of another embodiment of the present invention.

The conversion errors as mentioned above can be prevented by using the circuit construction of the type shown in FIG. 14. In FIG. 14, two select switches 22 and 23, which cooperate with each other, are provided between the output terminals of the first switch array 13 and the input terminals of the buffer amplifiers 15 and 16. By this construction, the two output signals of the first switch array can be interchangeably fed to the buffer amplifiers 15 and 16.

The output of the second switch array 18 is supplied to an averaging circuit 24, and the averaged output is fed to an output terminal 21.

An alternating controller 25 operates the select switches 22 and 23. The output voltages of the buffer amplifiers 15 and 16, produced in accordance with the states of the select switches 22 and 23, are fed to the N units of output voltages of the second resistance array 17. The output voltages V1 and V2 of the second switch array 18, produced as a result of the states of the select switches 22 and 23, are averaged in the averaging circuit 24. Thus, a voltage of (V1+V2)/2, which is exactly in accordance with the input digital code, is output from the output terminal 21 as an analog-converted signal.

Figure 15:
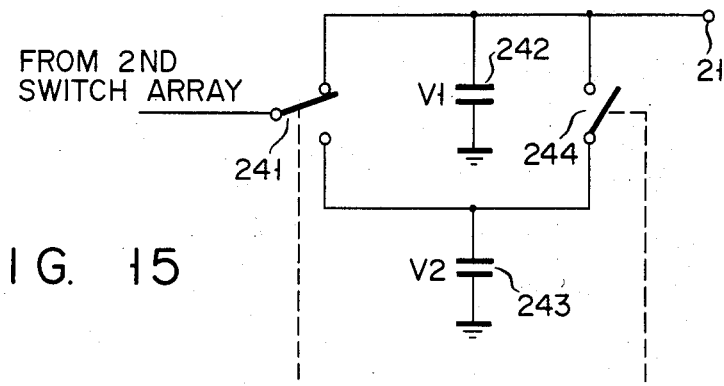
FIG. 15 shows one example of the averaging circuit in FIG. 14.

FIG. 15 shows an example of the averaging circuit 24. A signal from the second switch array 18 is selectively supplied to, and charged in, a first capacitor 242 or a second capacitor 243 through a first switch 241. The capacitors 242 and 243 have the same capacitance. The output voltage of the second switch array 18 is supplied to one electrode of each capacitor through the first switch 241, and the other electrode of each capacitor is grounded.

After the output voltages V1 and V2 of the second switch array, produced in accordance with the states of the select switches 22 and 23, are charged in the first and second capacitors 242 and 243, one electrode of the capacitor 242 and one electrode of the capacitor 243 are short-circuited, and the voltages V1 and V2 charged in the capacitors 242 and 243 are averaged. The averaged output is fed to the output terminal 21. The first and second switches 241 and 244 are controlled by the alternating controller 25 in synchronism with the select switches 22 and 23 and the averaging circuit 24.

Figure 16:
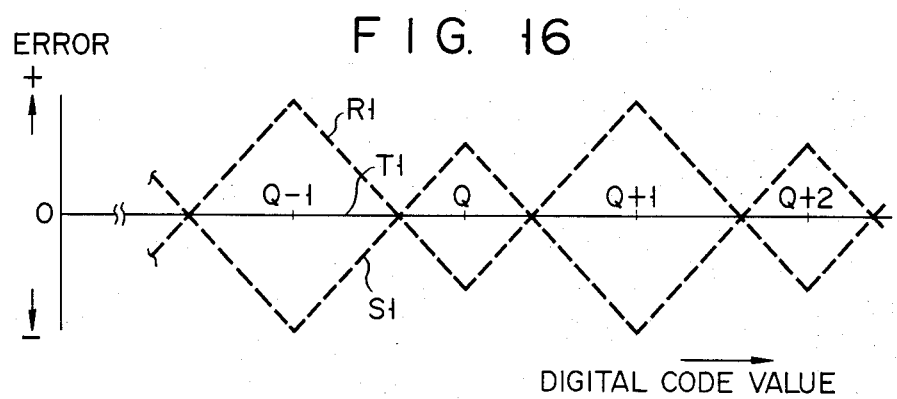
FIG. 16 is a graph explaining the operation of conversion error cancelling in the embodiment of FIG. 14.

When the conversion error as shown in FIG. 11 occurs due to the offset voltages Vos 15 and Vos 16 of the buffer amplifiers 15 and 16, the select switches 22 and 23 are controlled so that two kinds of conversion errors may be produced whose polarities are reverse to each other and whose absolute values are identical, as shown in FIG. 16. If these conversion errors are averaged, a conversion output T1, in which the errors are cancelled as shown in FIG. 16, can be obtained.

Figure 17:
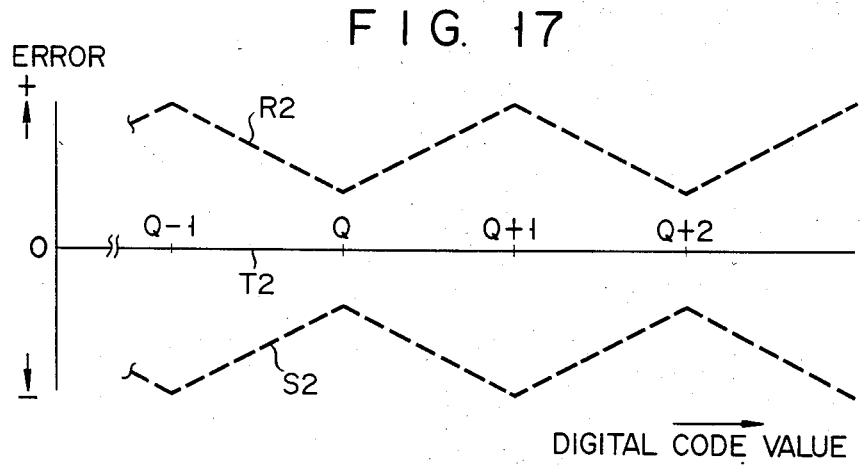
FIG. 17 is a graph showing the cancellation, according to the present invention, of the conversion errors of FIG. 12.

Similarly, when a conversion error with characteristics shown in FIG. 12 occurs due to the offset voltages of the buffer amplifiers 15 and 16, error voltages R2 and S2 shown in FIG. 17 are averaged and cancelled. A conversion output T2 can be obtained.

Figure 18:
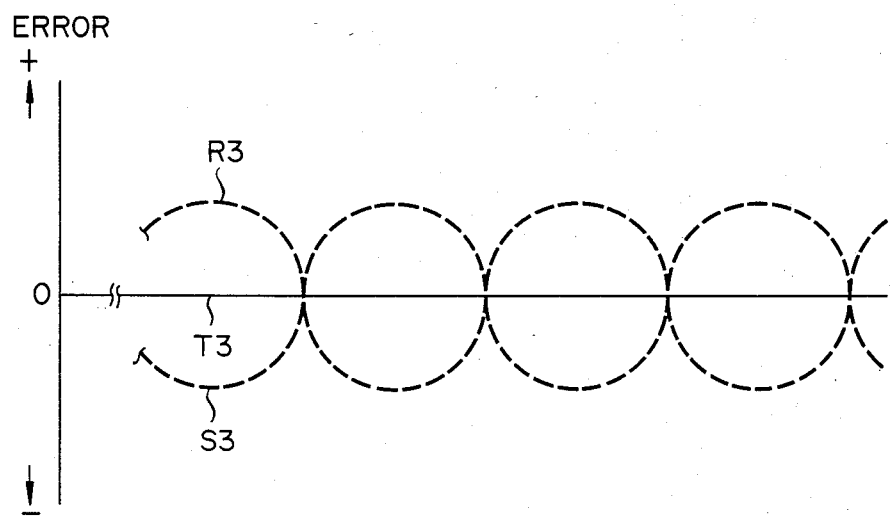
FIG. 18 is a graph showing the conversion error cancellation for errors due to linear errors in resistance value such as shown in FIG. 13.

If a conversion error with characteristics shown in FIG. 13 occurs due to resistance value errors in the second resistance array 17, conversion errors R3 and S3 having reverse polarities and the same absolute value appear as shown in FIG. 18 if the select switches 22 and 23 are operated. If conversion errors R3 and S3 are averaged in averaging circuit 24, a conversion output T3 is obtained, in which the conversion errors are cancelled.

As described above, by providing the select switches 22 and 23, averaging circuit 24 and alternating controller 25 (shown in FIG. 14), a highly accurate conversion output in which the conversion errors are offset can be obtained even if the conversion errors shown in FIGS. 11 and 12, which are caused by the offset voltages Vos 15 and Vos 16 of the buffer amplifiers 15 and 16, are superposed on the conversion error shown in FIG. 13 which is caused by resistance value errors in the second resistance array 17.

What is claimed is:
1. A digital analog converter, coupled to a reference voltage, for receiving a multi-bit digital signal and producing an analog value, said converter comprising:
 a first resistor array consisting of a plurality of resistors connected in series to divide said reference voltage into M output voltages, where M is a positive integer;
 a first switch array for receiving said output voltages of said first resistor array to select two adjacent ones of said output voltages in accordance with a first number of upper bits of said digital signal;
 a first select switch for outputting one of said two adjacent output voltages selected by said first switch array;
 a second select switch for outputting the other of said two adjacent output voltages selected by said first switch array;
 two buffer amplifiers, coupled to said select switches, each receiving a different one of the two selected output voltages from said select switches in accordance with the states of said first and second select switches;
 a second resistor array consisting of a plurality of resistors connected in series to receive said output voltages from said buffer amplifiers and divide said output voltages into N voltages, where N is a positive integer;
 a second switch array for selecting one of said output voltages from said second resistor array in accordance with the contents of a second number of lower bits of said digital signal;
 an averaging circuit including means for receiving the selected output voltage from the second switch array and obtaining an average of said selected output voltage; and
 an alternating controller for synchronously controlling said select switches and said averaging circuit.
2. A digital-analog converter according to claim 1 further including an intermediate resistor array, an intermediate switch array and an intermediate decoder,
 wherein said intermediate resistor array includes means for receiving first ones of said divided voltages from said first switch array, said first divided voltages being applied to both ends of said intermediate switch array, wherein said intermediate switch array includes means for selecting two adjacent ones of said divided voltages from said intermediate resistor array, and wherein said intermediate decoder includes means for controlling said intermediate switch array to code convert a third number of intermediate bits of said digital signal between said upper and lower bits in response to the lowest order bit of said upper bits which is applied to the intermediate decoder to cause the intermediate switch array to select two adjacent divided voltages from said intermediate resistor array and apply them to the second resistor array.

3. A digital-analog converter according to claim 1, wherein said first resistor array comprises resistors having an equal resistor value and connected in series with one another.

4. A digital-analog converter according to claim 1, wherein said second resistor array comprises resistors, all but two of which are equal in resistor value, connected in series with one another, and the other two resistors of said second resistor array having a value half of that of the other of said resistors in said second resistor array, said other two resistors each being connected in series to a different end of said second resistor array.

5. A digital-analog converter according to claim 1, wherein said first switch array comprises first and second array switches, said first array switches each receiving at one switch end the odd-numbered divided voltages of said first resistor array and being connected to one another at the other switch end, and said second array switches each receiving at one switch end the even-numbered divided voltages of said first resistor array and being connected to one another at the other switch end.

6. A digital-analog converter according to claim 1, wherein said first and second switch arrays employ analog switches provided with MOS FETs.

7. A digital-analog converter according to claim 1,
wherein said first switch array includes means for selecting the two output voltages in accordance with the changes in the upper bits of the digital signal such that when the value represented by the upper bits increases by a minimum unit, the higher of said output voltages selected is kept selected and an output voltage higher than and adjacent to the higher output voltage selected is newly selected, and when the value represented by the upper bits decreases by the minimum unit, the lower of said output voltages selected is kept selected and an output voltage lower than and adjacent to the lower voltage selected is newly selected, and wherein said second switch array includes means for selecting one of said divided voltages in accordance with the lower bits of the digital signal and the least significant bit of the upper bits of the digital signal.

8. A digital-analog converter according to claim 1, further comprising shift registers and latches, and wherein the digital signal which is to be converted to an analog signal is applied in series to said shift register whose outputs are transferred in parallel to said latches.

* * * * *